Oct. 31, 1967 W. L. GOFFE 3,350,205
METHOD OF IMAGE REPRODUCTION BY PHOTOPOLYMERIZATION AND BLUSHING
Filed April 27, 1964
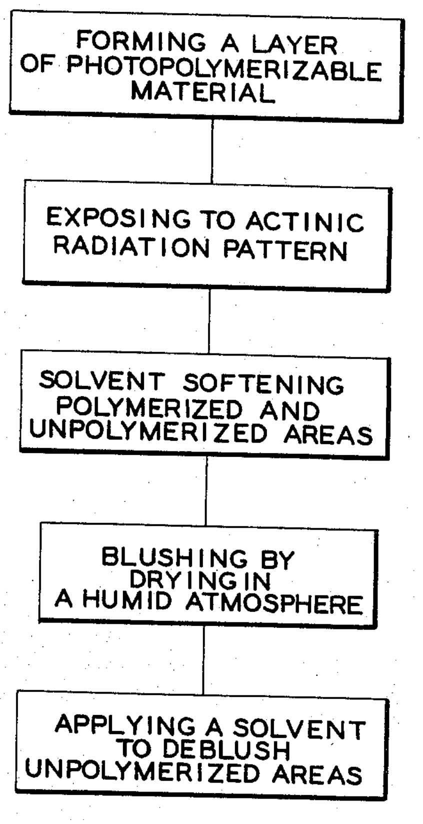
INVENTOR.
WILLIAM L. GOFFE
BY James J. Ralabate
ATTORNEY

United States Patent Office 3,350,205

Patented Oct. 31, 1967

3,350,205

METHOD OF IMAGE REPRODUCTION BY PHOTOPOLYMERIZATION AND BLUSHING

William L. Goffe, Webster, N.Y., assignor to Xerox Corporation, Rochester, N.Y., a corporation of New York Filed Apr. 27, 1964, Ser. No. 362,982

6 Claims. (Cl. 96—35.1)

ABSTRACT OF THE DISCLOSURE

This application is concerned with the following methods of image reproduction: (1) Wherein a layer of photopolymerizable material is uniformly blushed, then exposed to a pattern of actinic radiation, and finally, wherein said blushing is selectively erased in image configuration; (2) Wherein a layer of photopolymerizable material is exposed to a pattern of actinic radiation, then blushed, followed by selective erasing of said blushing in the non-light-exposed areas; and (3) Wherein a layer of photopolymerizable material is exposed to a pattern of actinic radiation, then exposed to solvent vapor only long enough to soften the non-light-exposed areas, followed by drying in a humid atmosphere so that blushing occurs only in the non-light-exposed areas.

This application relates to novel imaging methods. More specifically, it relates to a method wherein a layer of photopolymerizable material is first uniformly blushed, then exposed to a pattern of actinic radiation, and then selectively unblushed in image configuration or in which the layer is first exposed to a pattern of actinic radiation and then blushed in image configuration.

Blushing is the term applied to a common phenomenon in the coating art. When a solvent solution of a coating material is applied to a surface, particularly if the material is a lacquer including low-boiling highly volatile solvents, the resulting film often develops a milky appearance which is ordinarily considered objectionable. This phenomenon is referred to as blushing in the art and as well as in the specification and claims. It is due to a lowering of the temperature of the still wet coating below the dew point of the surrounding air caused by rapid evaporation of the solvent. The low temperature causes droplets of moisture to condense on the surface and presumably precipitate the coating material, resulting in a microscopically pock marked or porous surface after the remaining water and solvent have evaporated. The surface irregularities lead to light scattering and a milky appearance when viewed by either reflected or transmitted light. Various methods are employed in the coating art to eliminate blushing. One method is to carry out the coating operation in a dry atmosphere. Another method is to employ high boiling, low volatility solvents which evaporate slowly and do not greatly lower the temperature of the coating as it dries. A third method is to incorporate in the coating formulation a relatively small amount of very low volatility solvent. This keeps the coated film sufficiently soft for a sufficient time so that even if blushing occurs, the condensed moisture can re-evaporate and the film will recover a smooth surface before it has completely hardened.

Since the formation of a blushed film is a necessary step in this invention, the above methods should be avoided and high volatility solvents or high ambient humidity should be employed.

The coating material employed in this invention should be a film-forming photopolymerizable material. A photopolymerizable material is one which develops increased solvent resistance or heat resistance after exposure to light of appropriate wave length. Many such materials are known and many of them are sold or used in the printing or photoengraving arts. A particularly suitable material is KPR which is sold by the Eastman Kodak Company and which is a solvent solution of a material believed to be polyvinyl cinnamate. This material resembles a clear lacquer and may be applied by dipping, whirling, spraying, wiping, etc. It may be further diluted before use with a solvent such as acetone or mixed with small amounts of non-photopolymerizable resins such as styrene resins or vinyl resins. For purposes of the present invention, this material should be applied in darkness or under incandescent illumination to a smooth surface such as glass or polished metal. Since a very thin film is sufficient for carrying out the invention, the material may be conveniently wiped on. Since the material as sold does not readily blush under normal conditions of humidity, the coating operation should be carried out in a very damp atmosphere or, alternatively, the wet coating may be breathed upon immediately after it is applied. In this manner, a milky, light-scattering, blushed film is formed which is soon hard and ready for image formation but which can also be stored for several months, if desired.

The next step in carrying out the invention is to expose a blushed photopolymerizable layer to a pattern of actinic radiation. This is usually accomplished by contact, exposing the photopolymerizable layer to a transparency image in a conventional printing frame. When KPR is employed, suitable light sources include daylight, arc-light, fluorescent light, and particularly the light from so-called black light fluorescent lamps. Exposure time should be about the same as would be used if the photopolymerizable material were to be used in a conventional photomechanical process. When exposing KPR with black light lamps, the time may be on the order of a minute.

The final step in the process of the invention is to selectively erase the blushing in image configuration. This is accomplished by selectively softening the photopolymerizable material in areas which have not been hardened by exposure to light. This may be accomplished by uniformly heating the material or contacting it with a suitable solvent, preferably in vapor form. When the photopolymerizable material is KPR, a preferred method comprises contacting the layer with vapors of trichlorethylene. This is a relatively non-toxic material which readily softens unexposed KPR but has relatively little effect in exposed areas. In softened areas, the photopolymerizable material will recover its original, smooth, non-light-scattering surface by the action of surface-tension forces, but in hardened light exposed areas, the surface will retain its blushed configuration. After the blushing has been selectively erased, the layer may be rehardened by removing it from the solvent atmosphere or by returning it to room temperature, as the case may be. There results a stable image comprising blushed areas and areas which are smooth or only partly blushed. The image may be seen by the naked eye or it may be projected in a conventional projector if it is formed on a glass or other transparent substrate. Image resolution of 47 line pairs per millimeter has been obtained in this manner, as well as continuous tone reproduction.

Excessive or over long softening of the photopolymerizable material may cause erasure of the blushing even in light-struck areas. If this occurs, whether by accident or design, the desired image can be regenerated by thoroughly softening the photopolymerizable material with solvent, preferable in vapor form (unless the material is already so softened) and allowing the layer to re-harden in a humid atmosphere, causing blushing in all areas. If the layer is again heated or exposed to solvent vapors so as to soften non-light exposed areas only, the blush will be erased in these areas only, and the desired image pattern will re-appear.

In a still further variation of the invention, a photopolymerized layer may be exposed to a pattern of light and shadow without previously having been blushed. After exposure, the entire area is softened by prolonged exposure to solvent vapor and allowed to dry in a humid atmosphere so that the entire layer blushes, although some areas may blush more than others. If the layer is then softened by heat or vapor, only sufficiently to affect the non-light exposed areas, the blushing will erase in these areas only leaving a pattern of blushing in the light-exposed areas.

In still another form of the invention, an unblushed photopolymerizable layer is exposed to a pattern of light and shadow and is then exposed to a solvent vapor only long enough to soften the non-light exposed areas. If the layer is then allowed to dry in a humid atmosphere, blushing will occur in the non-light exposed areas. This is distinct from other forms of the invention in which the final images are comprised of blushed areas corresponding to light-exposed areas.

Although KPR has been described as a preferred photopolymerizable material, the method may also be carried out with a large variety of other photopolymerizable materials which are known to the art and many of which are commercially available. The only requirements are that the material can be coated from a volatile non-aqueous solvent solution, that it have film-forming properties, and that it can be hardened and made heat or solvent resistant by exposure to light.

Many materials exist which meet the above requirements but which are not normally considered photopolymerizable. A suitable material of this type is Stay belite Ester 10 which is a glycerol ester of hydrogenated rosin sold by the Hercules Powder Company. This material was dissolved in a 50% toluene solution and wiped onto a polished brass plate in a manner similar to that employed with KPR. Blushing was promoted by breathing on the still wet film about 5 seconds after it was applied. Since Staybelite Ester 10 is soluble in a wide variety of solvents, it would in general be preferable to use a more volatile solvent, such as acetone, to promote blushing. The Staybelite Ester is much less sensitive to light than materials normally considered to be photopolymerizable and an exposure of 1 hour was employed using closely adjacent black light fluorescent lamps. High quality images could be obtained after exposure either by heating the material until selective erasure of the blush was obtained or by exposing the material to an atmosphere of trichloroethylene vapor.

The principles and illustrative examples of the invention having been set forth, many variations will be apparent to those skilled in the art and form a part of this invention.

It is a further feature and therefore object of this invention that the images are mechanical in nature, being in the form of variations in the configuration of a surface. It is accordingly possible to readily duplicate images prepared in accordance with the invention by using casting resins or other conventional replica-making processes. In particular, the techniques employed for the replication of phonograph record masters may be employed.

What is claimed is:

1. The method of image configuration comprising:
   (a) forming a layer of photopolymerizable material on a supporting substrate;
   (b) exposing said layer to a pattern of actinic electromagnetic radiation whereby exposed areas photopolymerize;
   (c) softening both said polymerized and unpolymerized areas by prolonged exposure to a solvent vapor;
   (d) allowing said layer to dry in a humid atmosphere so that the entire layer surface blushes;
   (e) applying to said layer a solvent which more rapidly dissolves said unpolymerized areas than said polymerized areas;
   (f) drying said layer, whereby background areas return to an unblushed condition.

2. The method of claim 1 wherein said layer is formed from a solvent solution comprising polyvinyl cinnamate.

3. The method of claim 1 wherein said exposure is to ultraviolet light.

4. The method of claim 1 wherein said solvent is applied to the free surface of the layer, after exposure, as a vapor.

5. The method of claim 4 wherein said solvent is trichlorethylene.

6. The method of claim 5 wherein the photopolymerizable material comprises polyvinyl cinnamate.

References Cited

UNITED STATES PATENTS

| | | | |
|---|---|---|---|
| 2,304,632 | 12/1942 | Faelten | 117—63 |
| 2,790,727 | 4/1957 | Hilborn | 117—63 |
| 3,014,301 | 12/1961 | Grupe | 117—36.7 |
| 3,218,168 | 11/1965 | Workman | 117—36.7 |

MURRAY KATZ, *Primary Examiner.*